(12) United States Patent
Farooq et al.

(10) Patent No.: US 7,855,137 B2
(45) Date of Patent: Dec. 21, 2010

(54) METHOD OF MAKING A SIDEWALL-PROTECTED METALLIC PILLAR ON A SEMICONDUCTOR SUBSTRATE

(75) Inventors: Mukta G. Farooq, Hopewell Junction, NY (US); Waldemar Walter Kocon, Newburgh, NY (US); Kevin Shawn Petrarca, Newburgh, NY (US); Richard Paul Volant, New Fairfield, CT (US)

(73) Assignee: International Business Machines Corporation, Armonk, NY (US)

( * ) Notice: Subject to any disclaimer, the term of this patent is extended or adjusted under 35 U.S.C. 154(b) by 114 days.

(21) Appl. No.: 12/190,173

(22) Filed: Aug. 12, 2008

(65) Prior Publication Data

US 2010/0038777 A1    Feb. 18, 2010

(51) Int. Cl.
*H01L 21/4763*   (2006.01)
*H01L 21/44*     (2006.01)

(52) U.S. Cl. .................. 438/618; 438/613; 438/622

(58) Field of Classification Search .................. 438/613, 438/618, 622
See application file for complete search history.

(56) References Cited

U.S. PATENT DOCUMENTS

| | | | |
|---|---|---|---|
| 6,177,636 B1 | 1/2001 | Fjelstad | |
| 6,348,734 B1 * | 2/2002 | Brown | 257/767 |
| 6,368,951 B2 * | 4/2002 | Higashi et al. | 438/618 |
| 6,818,545 B2 | 11/2004 | Lee et al. | |
| 6,893,961 B2 * | 5/2005 | Akram | 438/652 |
| 7,135,770 B2 * | 11/2006 | Nishiyama et al. | 257/734 |
| 2004/0007779 A1 | 1/2004 | Arbuthnot et al. | |
| 2005/0017376 A1 | 1/2005 | Tsai | |

* cited by examiner

*Primary Examiner*—Luan C Thai
(74) *Attorney, Agent, or Firm*—Lisa V. Jaklitsch; Ira D. Blecker; Katherine S. Brown

(57) ABSTRACT

A method of forming conductive pillars on a semiconductor wafer in which the conductive pillars are plated with a protecting coating of Ni, Co, Cr, Rh, NiP, NiB, CoWP, or CoP. Only the side of the conductive pillars are plated. The ends of the conductive pillars are free of the protective plating so that the conductive pillars can be readily joined to the pads of a packaging substrate. Also disclosed is a sidewall-protected conductive pillar having a protective coating of Ni, Co, Cr, Rh, NiP, NiB, CoWP, or CoP thereon.

17 Claims, 4 Drawing Sheets

METHOD OF MAKING A SIDEWALL-PROTECTED METALLIC PILLAR ON A SEMICONDUCTOR SUBSTRATE

BACKGROUND OF THE INVENTION

The present invention is related in general to the field of semiconductor devices and processes and more specifically to the wafer-level fabrication of fine-pitch, high aspect ratio conductive pillars for solder interconnections.

In the conventional integrated circuit chip, wire-bonding is generally used to electrically connect the bonding pads of a chip to a substrate. However, flip-chip bonding and inner lead bonding gradually replaced wire-bonding for the solutions of recent integrated circuit chip development in smaller dimension, higher density and faster electrical response. It is necessary that bumps are formed on the active surface of an integrated circuit chip to bond to a substrate for flip-chip bonding and inner lead bonding applications. The bumps have various shapes to meet different requirements of manufacturing processes such as sphere, hemisphere, lump, and pillar. Normally spherical or hemispherical bumps are formed by low temperature solder paste which is heated to melt in a reflow furnace and then cooled down to form their shapes according to their surface tension. Pillars, sometimes also called "posts" (collectively referred to hereafter as just "pillars"), are relatively taller structures and are typically made of high conductivity materials other than solder, such as copper. The pillars do not change their shape at the chip-bonding temperature so that there is no solder bridging issue. The pillars are good candidates for integrated circuit chips in fine pitch bumping.

The semiconductor industry is currently using a method of incorporating a copper pillar which is created as the final step after the back end structures are built. This copper pillar is used to increase the reliability of the packaged chip because it is a taller structure that joins two entities (silicon chip and organic package, for example) which are severely mismatched in terms of their coefficients of thermal expansions (CTEs). The additional height of pillars in comparison to standard solder bump interconnects allows for a lowering of the strain for a given amount of expansion mismatch.

The pillar is ultimately joined to the final packaging substrate using solders that are typically used for solder bumps. Copper is wettable by solder, as long as the surface of the copper is not heavily oxidized or corroded. When the solder is elevated to a temperature that causes the solder to become a liquid, the liquid solder flows onto the copper surface uninhibited.

Lee et al. U.S. Pat. No. 6,818,545 and Tsai U.S. Patent Application Publication US 2005/0017376, the disclosures of which are incorporated by reference herein, disclose in general metallic pillars having solder caps.

Arbuthnot et al. U.S. Patent Application Publication US 2004/0007779, the disclosure of which is incorporated by reference herein, discloses in FIGS. 11A, 11B and 11C a metallic pillar after reflow of a solder cap. In FIGS. 11A and 11B, the solder has reflowed down the sides of the pillar. In FIG. 11C, the pillar is made of a material which is not wettable by the solder such as titanium or tantalum so that upon reflow of the solder, the solder does not wet the sides of the pillar. However, a plated nickel layer is necessary on the top of the pillar for the solder to adhere to the pillar.

Fjelstad U.S. Pat. No. 6,177,636, the disclosure of which is incorporated by reference herein, discloses metallic pillars which are plated and which may be coated with solder.

Most solders in use today in the electronics industry contain tin (Sn). With the advent of, and the increasing use of lead (Pb)-free solders, the relative amount of Sn in the solders has gone up considerably, so that 90-99% (by atomic percent) of the solder is comprised of Sn. Sn and copper have a natural affinity for each other and will readily form intermetallic compounds. These intermetallic compounds are brittle, and undesirable. These intermetallic compounds also consume "free copper" and may cause other problems related to spalling or breakage, and further movement of these intermetallics.

BRIEF SUMMARY OF THE INVENTION

The advantages of the invention have been achieved by providing, according to a first aspect of the invention, a method of forming sidewall-protected metallic pillars on a semiconductor substrate, the method comprising the steps of:

forming a plurality of pillars on a semiconductor substrate, the pillars forming the input/output connections to the next level of packaging;

plating the pillars with a metallic material including an end of each of the pillars;

removing the metallic material from the end of each of the pillars.

According to a second aspect of the invention, there is provided a method of forming sidewall-protected metallic pillars on a semiconductor substrate, the method comprising the steps of:

forming a plurality of pillars on a semiconductor substrate, the pillars forming the input/output connections to the next level of packaging, each of the pillars having an exposed end;

protecting the exposed end from being exposed to the environment by an article;

plating the pillars with a metallic material except for the exposed end; and removing the article.

According to a third aspect of the invention, there is provided a sidewall-protected metallic pillar on a semiconductor substrate comprising a semiconductor substrate having a plurality of metallic pillars thereon, the pillars forming the input/output connections to the next level of packaging, each of the pillars having an exposed end;

the pillars being plated with a metallic material except for the exposed ends of the pillars which are not plated.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
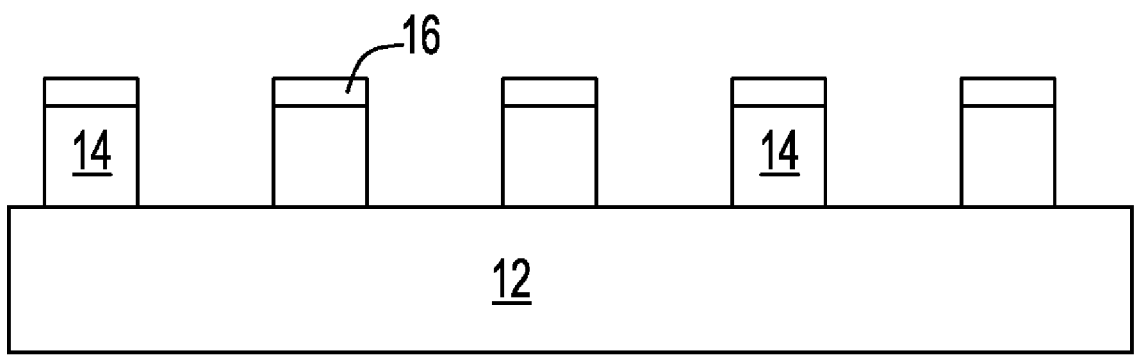
FIG. 1 is a side view of a portion of a semiconductor wafer having a plurality of conductive pillars.

Referring to the Figures in more detail, and particularly referring to FIG. 1, there is shown a portion of a semiconductor wafer 12 having a plurality of copper pillars 14. On top of each of the pillars 14 is a quantity of solder 16. In practice, the semiconductor wafer 12 would be sectioned into individual chips and then the plurality of copper pillars 14 would be aligned with and then joined to a plurality of pads on a semiconductor packaging substrate (not shown). The solder would be reflowed so as to join the plurality of copper pillars 14 with the plurality of pads. Since the solder 16 easily wets the copper pillars 14, the sides of the copper pillars 14 would be coated with solder. As noted above, the wetting of the copper pillars 14 with solder can lead to problems and is thus to be avoided if possible.

Accordingly, it would be desirable to have conductive pillars, preferably copper pillars, which have a protective coating on the side of the copper pillars to prevent deleterious reaction between the liquefied solder and the copper. Further, it would be desirable to have the ends of the conductive pillars be free of the protective coating so that there is a good bond between the conductive pillar, solder and packaging substrate pad.

Figure 2:
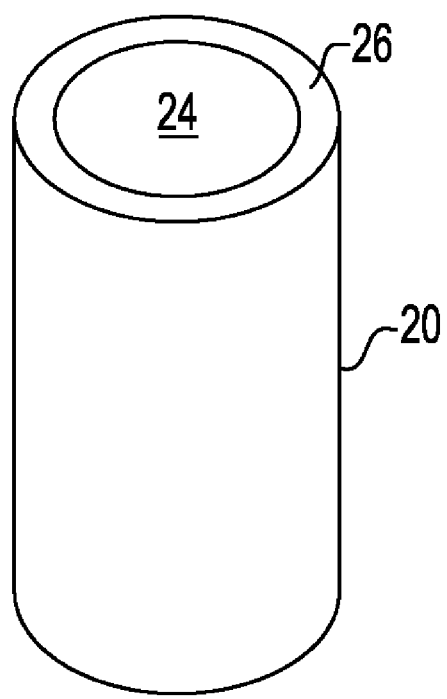
FIG. 2 is a perspective view of a conductive pillar according to the present invention.

FIG. 2 is an enlarged view of a conductive pillar 20 according to the present invention. Conductive pillar 20 has a protective coating 26 of nickel (Ni), cobalt (Co), chromium (Cr), rhodium (Rh), nickel phosphorus (NiP), nickel boron (NiB), cobalt tungsten phosphorus (CoWP) or cobalt phosphorus (CoP). Conductive pillar 20, usually and preferably is made from copper but could also be made from other materials having high electrical conductivity such as gold (Au) or silver (Ag). Importantly, the end 24 of conductive pillar 20 has no coating so that the solder can make good physical and electrical contact with the conductive metal of the conductive pillar 20.

Referring now to FIGS. 3A through 3D, a method will be described for making the conductive pillars 20 with copper being the preferred material. While the remaining description will be focused on copper as the preferred conductive material for the conductive pillar, it should be understood that other materials as mentioned above for the conductive pillar are within the scope of the present invention. The process begins in FIG. 3A with a semiconductor wafer 12 having a conventional barrier layer 32 and copper seed 34 deposited across the wafer 12.

Figure 3A:
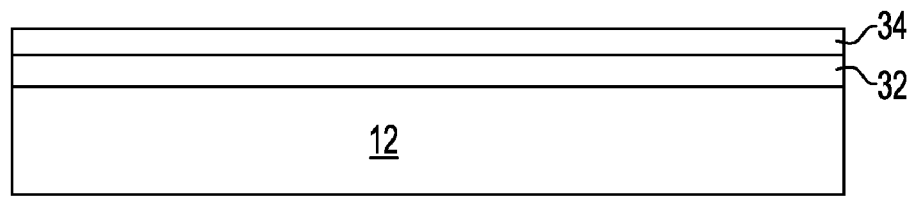
FIGS. 3A to 3D are partial cross-sectional views illustrating a process for forming a conductive pillar on a semiconductor wafer.
Figure 3B:
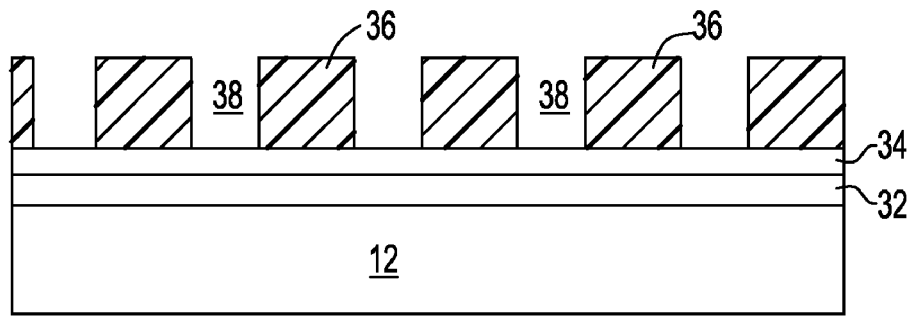

Then, in FIG. 3B, a thick conventional photo active polymer film that is about 75 um thick is applied over the semiconductor wafer 12 and exposed and developed to expose areas 38 where the copper pillars will be formed. A suitable polymer is Riston® photo polymer (Riston is a registered trademark of E.I. DuPont De Nemours, Wilmington, Del.).

Figure 3C:
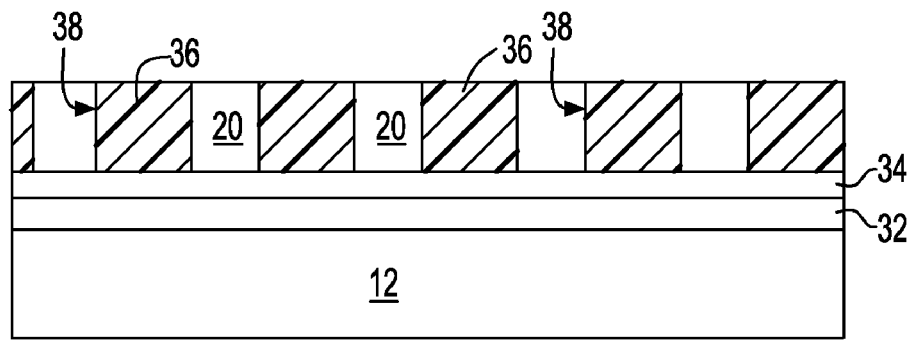
Figure 3D:
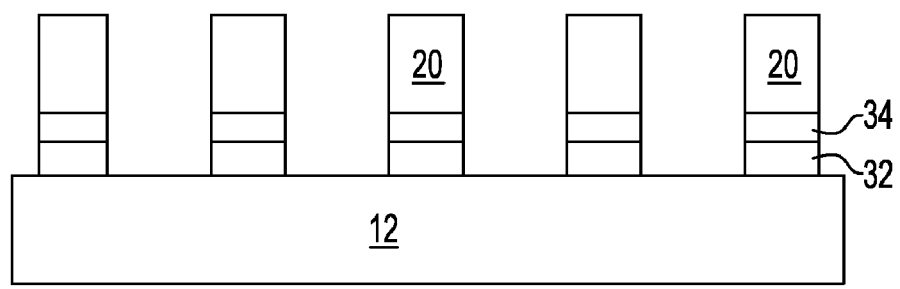

Referring now to FIG. 3C, the seed layer 34 may then be used to facilitate electroplating of copper in the openings 38 (FIG. 3B). This process is also known as pattern plating through a resist stencil which enables the creation of copper pillars 20 in the openings 38.

Thereafter, the thick polymer film is removed. If the polymer is Riston photo polymer, it may be removed by an NMP (N-methyl pyrolidone) and a commercial photoresist strip such as that available from AZ Electronic Materials, Branchburg, N.J. Then, the copper seed and barrier layer are conventionally etched to remove them between the copper pillars 20 to result in the structure shown in FIG. 3D.

The copper pillars 20 are next plated to protect the sides of the copper pillars 20. There are two preferred embodiments of the invention disclosed herein for plating the copper pillars 20. In one preferred embodiment of the present invention, the copper pillars 20 are plated all over and then the protective plating is removed from the ends 24 of the copper pillars 20. In another preferred embodiment of the present invention, only the sides of the copper pillars 20 are plated while the ends 24 are masked in some manner such that plating does not occur on the ends 24 of the copper pillars 20. With each preferred embodiment of the invention, the ends 24 of the copper pillars 20 are free of the plated material.

Figure 4:
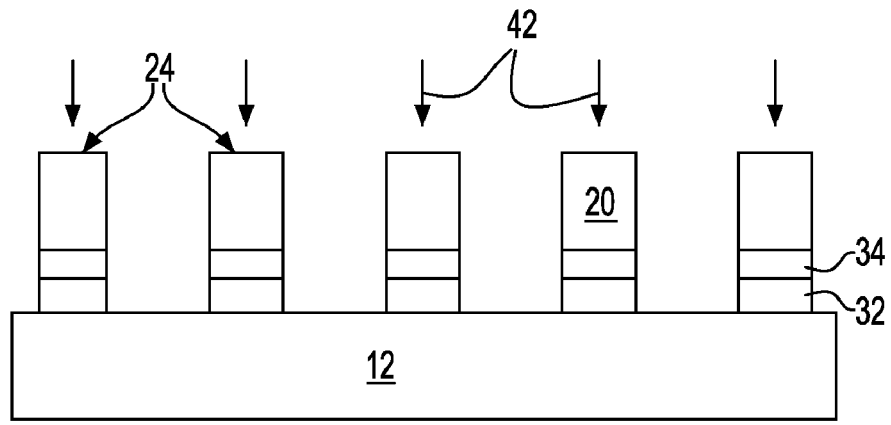
FIG. 4 is a schematical representation of one method of removing plated material from the ends of conductive pillars according to the present invention.

In one preferred embodiment of the present invention, the copper pillars 20 are plated with Ni, Co, Cr, Rh, NiP, NiB, CoWP, or CoP using a conventional electroless plating bath. All the exposed copper of the copper pillars 20, including the ends 24, will be plated with a layer 26 of Ni, Co, Cr, Rh, NiP, NiB, CoWP, or CoP. A preferred thickness of the plating is in the range of 200 A-2000 A. The next step is to remove the plating from the ends 24 of the copper pillars 20. One preferred methodology for removing the plating from the ends of the copper pillars is by a high rate (wattage) sputtering technique. Referring now to FIG. 4, the ends 24 of the copper pillars 20 are exposed to argon sputtering 42 which removes any plating from the ends 24 of the copper pillars 20.

Figure 5:
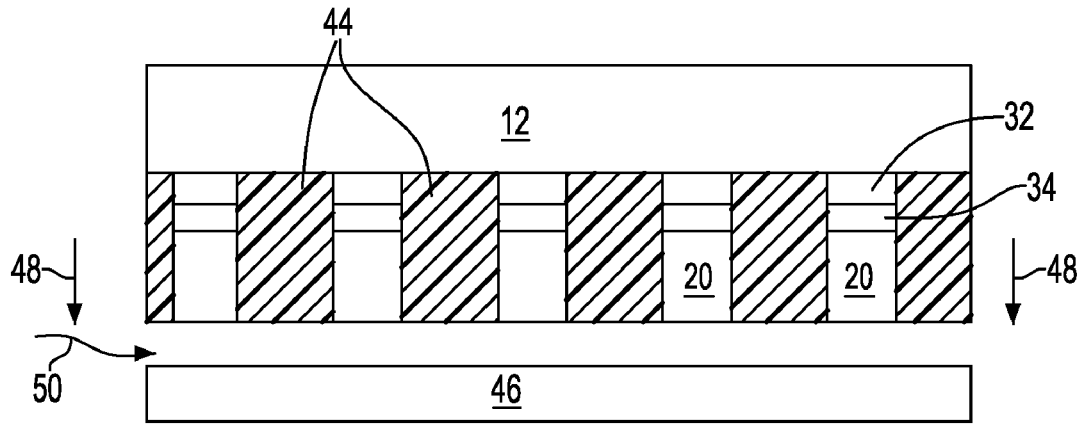
FIG. 5 is a schematical representation of another method of removing plated material from the ends of conductive pillars according to the present invention.

Another preferred methodology for removing the plating from the ends of the copper pillars 20 is shown in FIG. 5. In this methodology, chemical—mechanical polishing is utilized. Supportive material 44, such as a polyimide but could be any other material, including an insulating polymer, that is capable of providing support to the copper pillars 20 and is easily removed, is placed around the copper pillars 20. One preferred method of applying the supportive material is by a spin-on application. Then, chemical-mechanical polishing is performed on a polishing pad 46, indicated by arrows 48, wherein the supportive material 44 and copper pillars 20 are brought into contact with polishing pad 46 while a slurry 50 is dispensed on the polishing pad 46. The supportive material 44 is then removed by an NMP and photoresist strip.

Removal of the plating from the ends 24 of the copper pillars 20 is critical to ensure a clean joining surface for the solder.

Figure 6:
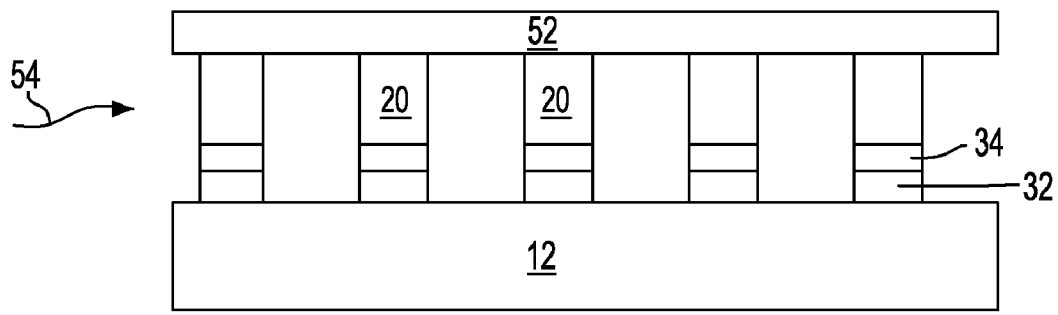
FIG. 6 is a schematical representation of a first method of selectively plating the conductive pillars according to the present invention.

In another preferred embodiment of the present invention, only the sides of the copper pillars 20 are plated while the ends 24 are masked in some manner such that plating does not occur on the ends 24 of the copper pillars 20. Several methodologies may be practiced to achieve this result. Referring first to FIG. 6, one preferred methodology is shown for selectively plating the copper pillars 20 wherein a Riston photo polymer layer (or similar polymeric material such as Kapton® polyimide (Kapton is a registered trademark of E.I. DuPont De Nemours, Wilmington, Del.)) is applied to the top of the copper pillars 20. A conventional plating solution, indicated by arrow 54, is then applied to the copper pillars 20 to electrolessly plate the copper pillars 20 with Ni, Co, Cr, Rh, NiP, NiB, CoWP, or CoP. The Riston photo polymer layer 52 (or similar material) effectively seals the ends 24 of the copper pillars 20 so that they are not plated. The Riston photopolymerlayer may be removed using an NMP and photoresist strip.

Figure 7:
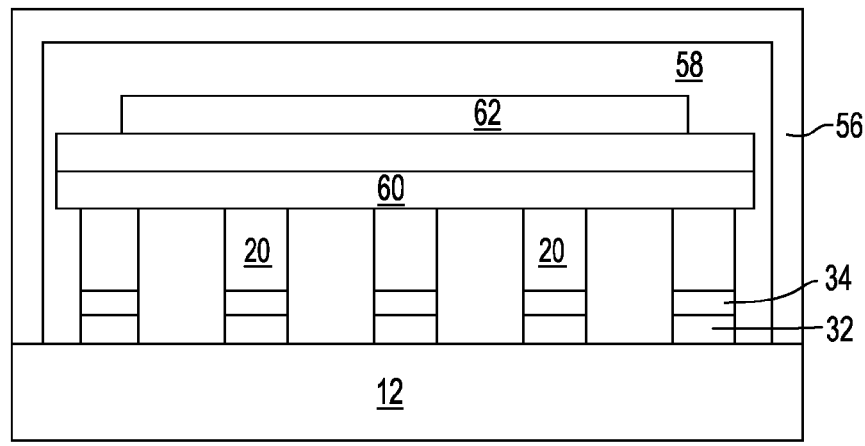
FIG. 7 is a schematical representation of a second method of selectively plating the conductive pillars according to the present invention.

Another preferred methodology for selectively plating the copper pillars 20 is illustrated in FIG. 7. The semiconductor wafer 12 is placed against a plating cell 56 having a plating solution 58. The cathode 60 of the plating cell 56 comprising a conductive polymer is placed against the ends 24 of the copper pillars 20. A current is applied to the anode 62 which causes electroplating of Ni, Co, Cr, Rh, NiP, NiB, CoWP, or CoP on the side of each of the copper pillars 20. The cathode 60 effectively seals the ends 24 of the copper pillars 20 so that none of the NiP, NiB, CoWP, or CoP is applied to the ends of copper pillars 20.

Figure 8:
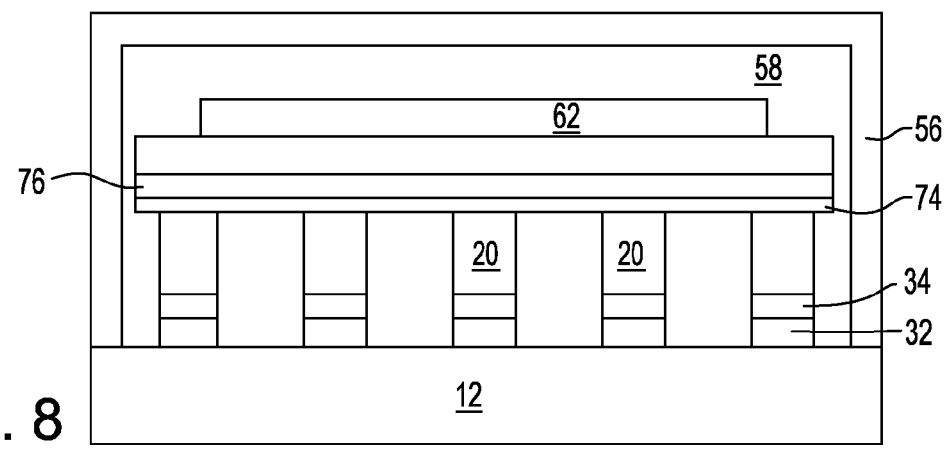
FIG. 8 is a schematical representation of a third method of selectively plating the conductive pillars according to the present invention.
Figure 9:
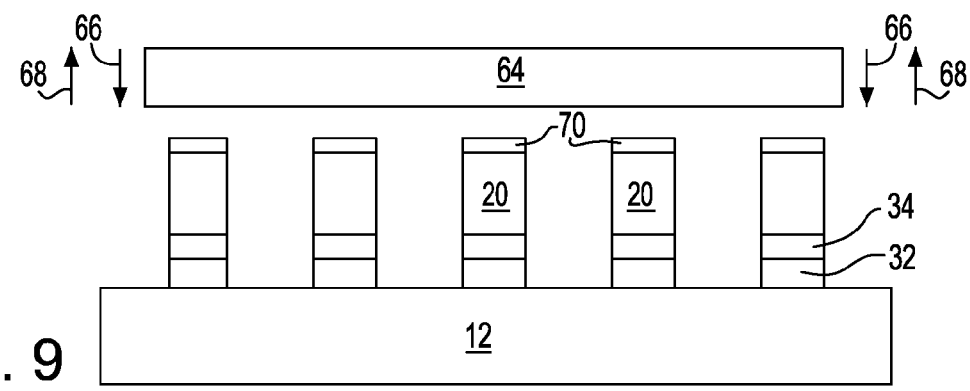
FIG. 9 is a schematical representation of a fourth method of selectively plating the conductive pillars according to the present invention.

Another preferred methodology for selectively plating the copper pillars 20 is illustrated in FIG. 8. This methodology is similar to that shown in FIG. 7 except that there is, in FIG. 8, a thin conductive film 74 on an insulating polymer 76 so that the plating current is passed directly from the thin conductive film 74 through the ends of the copper pillars 20.

Another preferred methodology for selectively plating the copper pillars 20 is illustrated in FIG. 98. A pad 64 having benzotriazole (BTA) or polyacrylic acid (PAA) is moved downwardly (indicated by arrows 66) into contact with the ends 24 of the copper pillars 20 and then upwardly (indicated by arrows 68). When pad 64 makes contact with the ends 24 of the copper pillars 20, a residue 70 of BTA or PAA is left on the ends 24 of the copper pillars 20. The semiconductor wafer 12 may then be immersed in a solution for electrolessly plating of Ni, Co, Cr, Rh, NiP, NiB, CoWP, or CoP. The residue 70 of BTA or PAA prevents the plating of the ends 24 of the copper pillars 20. After the plating is completed, the BTA or PAA may be removed by rinsing in alcohol.

Preventing the Ni, Co, Cr, Rh, NiP, NiB, CoWP, or CoP from plating the ends 24 of the copper pillars 20 is critical to ensure a clean joining surface for the solder.

Once the copper pillars 20 have been manufactured and plated as described above so that the ends 24 of the copper pillars 20 are clean and free of plated material, solder may be applied. Solder may be deposited on the copper pillars 20, or alternately, may be deposited on the pads of the packaging substrate. The copper pillars 20 and pads of the packaging substrate are made to contact with the solder interposed therebetween, and then the whole assembly is heated to cause reflow of the solder. The solder will then flow and join the copper pillars 20 and pads of the packaging substrate. Because the ends 24 of the copper pillars 20 are clean and free of plated material, the solder will coat the ends 24 of the copper pillars with a desirable wetting angle. Any solder that flows to the side of the copper pillars 20 will react with the Ni, Co, Cr, Rh, NiP, NiB, CoWP, or CoP. However those materials will not allow the tin in the solder to freely interact with the underlying copper pillars 20. Surface interactions with the plated material may lead to some intermetallic formation (for example, Ni—Sn intermetallics) which is generally self-limiting and is not considered to be a problem.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

The invention claimed is:

1. A method of forming sidewall-protected metallic pillars on a semiconductor substrate, the method comprising the steps of:
    forming a plurality of pillars on a semiconductor substrate, the pillars forming the input/output connections to the next level of packaging, each of the pillars having sidewalls and an exposed end;
    covering the exposed end of each of the pillars with a covering material;
    plating the sidewalls of each of the pillars with a metallic material, wherein the metallic material is selected from the group consisting of nickel, cobalt, chromium, rhodium, nickel phosphorus, nickel boron, cobalt tungsten phosphorus and cobalt phosphorus;
    removing the covering material from the end of each of the pillars.

2. The method of claim 1 wherein the pillars are made from copper.

3. The method of claim 1 further comprising the step of inserting a supportive material between the pillars.

4. The method of claim 3 wherein the supportive material is a polyimide.

5. The method of claim 1 further comprising covering the exposed end with a covering material by plating the exposed end with said metallic material.

6. The method of claim 5 wherein the step of removing the metallic material from the end of the pillars comprises removing the material by sputtering.

7. The method of claim 1 wherein said covering material protects the exposed end from being exposed to the environment, the method further comprising the steps of:
    plating the pillars with a metallic material after said covering step; and
    removing said covering material after said plating step.

8. The method of claim 7 wherein the step of covering comprises placing a sheet of polymeric material across the ends of the pillars so as to prevent the plating solution from making contact with the ends of the pillars.

9. A method of forming sidewall-protected metallic pillars on a semiconductor substrate, the method comprising the steps of:
    forming a plurality of pillars on a semiconductor substrate, the pillars forming the input/output connections to the next level of packaging, each of the pillars having sidewalls and an exposed end;
    covering the exposed end with a covering material, wherein said covering material protects the exposed end from being exposed to the environment;
    plating the sidewalls with a metallic material after said covering step;
    removing the covering material from the end of each of the pillars after said plating step;
    wherein the step of covering comprises placing a conductive polymer against the ends of the pillars and passing current to the pillars, the conductive polymer preventing plating solution from making contact with the ends of the pillars.

10. The method of claim 9 wherein the conductive polymer is mounted on a glass plate.

11. The method of claim 7 wherein the covering step comprises placing a thin conductive film against the ends of the pillars and passing current to the pillars, the thin conductive film preventing plating solution from making contact with the ends of the pillars.

12. The method of claim 11 wherein the thin conductive film is mounted on an insulating polymer.

13. The method of claim 7 wherein the covering step comprises pressing the ends of the pillars against a pad that has a substance that prevents plating of the ends.

14. The method of claim 13 wherein the substance is selected from the group consisting of benzotriazole and polyacrylic acid.

15. The method of claim 5 wherein the step of removing the covering material from the end of the pillars comprises removing the metallic material by chemical mechanical polishing.

16. The method of claim 1 wherein the step of removing the covering material occurs prior to a step of joining each of the pillars to the next level of packaging.

17. The method of claim 2 wherein after the step of removing, the ends of each of the pillars are free of plated metallic material and further comprising the step of applying solder directly to the ends of each of the copper pillars that are free of plated metallic material.

* * * * *